United States Patent
Juvonen et al.

(10) Patent No.: US 10,031,168 B2
(45) Date of Patent: Jul. 24, 2018

(54) DETECTION OF ISLANDING CONDITION IN ELECTRICITY NETWORK

(71) Applicant: ABB Technology AG, Zurich (CH)

(72) Inventors: Linda Juvonen, Lohja (FI); Mikko Routimo, Espoo (FI)

(73) Assignee: ABB Schweiz AG, Baden (CH)

( * ) Notice: Subject to any disclaimer, the term of this patent is extended or adjusted under 35 U.S.C. 154(b) by 0 days.

(21) Appl. No.: 14/671,390

(22) Filed: Mar. 27, 2015

(65) Prior Publication Data

US 2015/0276832 A1    Oct. 1, 2015

(30) Foreign Application Priority Data

Mar. 31, 2014   (EP) ..................................... 14162741

(51) Int. Cl.
  *G01R 23/00*   (2006.01)
  *G01R 23/12*   (2006.01)
  (Continued)

(52) U.S. Cl.
  CPC .............. *G01R 23/15* (2013.01); *H02H 3/46* (2013.01); *H02J 3/38* (2013.01); *H02H 1/003* (2013.01);
  (Continued)

(58) Field of Classification Search
  CPC .......... G01R 23/15; H02H 3/46; H02H 1/003; H02J 3/38; H02J 2003/388; Y02B 70/3225; Y04S 20/222; Y10T 307/839
  (Continued)

(56) References Cited

U.S. PATENT DOCUMENTS

| 6,172,889 B1 | 1/2001 | Eguchi et al. |
| 6,219,623 B1 * | 4/2001 | Wills ...................... H02J 3/383 290/40 B |

(Continued)

FOREIGN PATENT DOCUMENTS

| CN | 102437587 | 5/2012 |
| CN | 102565598 | 7/2012 |

(Continued)

OTHER PUBLICATIONS

Office Action (Patent Examination Report No. 1) dated Sep. 7, 2015, by the Australian Patent Office in corresponding Australian Patent Application No. 2015201507. (4 pages).

(Continued)

*Primary Examiner* — Giovanni Astacio-Oquendo
(74) *Attorney, Agent, or Firm* — Taft Stettinius & Hollister LLP; J. Bruce Schelkopf

(57) ABSTRACT

A method for single-phase islanding detection in a three-phase electricity network, can include supplying power into a three-phase electricity network (EN) by a power supply assembly (PSA), the electricity network (EN) having a network voltage, and providing a stimulus signal into a positive sequence electric quantity of the electricity network, the positive sequence electric quantity being current, power or a derived quantity thereof. A magnitude and/or a rate of change of an indicative element of a negative sequence component of the network voltage is monitored, a frequency domain of the indicative element including a frequency corresponding to the stimulus signal. A single phase islanding condition is detected in the electricity network (EN) if the magnitude and/or rate of change of the indicative element exceeds a predetermined limit value.

17 Claims, 1 Drawing Sheet

(51) Int. Cl.
  *G01R 23/15* (2006.01)
  *H02H 3/46* (2006.01)
  *H02J 3/38* (2006.01)
  *H02H 1/00* (2006.01)

(52) U.S. Cl.
  CPC ..... *H02J 2003/388* (2013.01); *Y10T 307/839* (2015.04)

(58) Field of Classification Search
  USPC ................................ 324/76.52, 76.11, 76.39
  See application file for complete search history.

(56) References Cited

U.S. PATENT DOCUMENTS

| | | | | |
|---|---|---|---|---|
| 6,476,521 | B1* | 11/2002 | Lof | H02J 3/24 307/102 |
| 7,376,491 | B2* | 5/2008 | Walling | H02J 3/38 700/286 |
| 7,408,268 | B1* | 8/2008 | Nocentini | H02J 3/38 307/16 |
| 7,466,570 | B2* | 12/2008 | Lin | H02J 3/00 363/39 |
| 9,124,127 | B2* | 9/2015 | Timbus | H02J 3/381 |
| 2006/0224336 | A1* | 10/2006 | Petras | H04L 12/66 702/62 |
| 2006/0259255 | A1* | 11/2006 | Anderson | G06F 19/00 702/64 |
| 2009/0160260 | A1* | 6/2009 | Bright | H02J 3/38 307/87 |
| 2011/0309684 | A1 | 12/2011 | Song et al. | |
| 2013/0270974 | A1 | 10/2013 | Wang et al. | |
| 2014/0078625 | A1 | 3/2014 | Zheng et al. | |

FOREIGN PATENT DOCUMENTS

| | | |
|---|---|---|
| CN | 103217595 | 7/2013 |
| CN | 103323704 | 9/2013 |
| CN | 103412207 | 11/2013 |
| CN | 103630782 | 3/2014 |
| EP | 0 810 713 A2 | 12/1997 |

OTHER PUBLICATIONS

Search Report dated Sep. 24, 2014, by the European Patent Office for Application No. 14162741.

European Office Action dated Feb. 2, 2018; Application No. 14162741.4; 6 pgs.

Houshang Karimi; Negative-Sequence Current Injection for Fast Islanding Detection of a Distributed Resource Unit, IEEE Transactions on Power Electronics; vol. 23, No. 1; Jan. 2008; pp. 298-307; Piscataway, New Jersey.

Guillermo Hernandez-Gonzalez; Current Injection for Active Islanding Detection of Electronically-Interfaced Distributed Resources; IEEE Transactions on Power Delivery; vol. 21, No. 3; Jul. 2006; Piscataway, New Jersey.

* cited by examiner

DETECTION OF ISLANDING CONDITION IN ELECTRICITY NETWORK

RELATED APPLICATION

This application claims priority under 35 U.S.C. § 119 to European Patent Application No. 14162741.4 filed in Europe on Mar. 31, 2014, the entire content of which is hereby incorporated by reference in its entirety.

FIELD

The present disclosure relates to detection of a single-phase islanding condition in a three-phase electricity network.

BACKGROUND INFORMATION

Distributed energy resource units, like solar cells or wind turbines, connected to a common electricity network provide in this electricity network islands (i.e., parts of the common electricity network, which are provided with power generation of their own). A single-phase islanding condition is a partial loss-of-mains situation in which a single phase of an electricity network incorporating power generation loses connection with the rest of the common electricity network. It is important to detect a single-phase islanding condition since it causes a safety hazard within the electricity network being partially separated from the common electricity network.

There are several known methods for single-phase islanding detection in a three-phase electricity network. A known method for single-phase islanding detection involves adding a low frequency stimulus reference signal into a reactive current reference of a frequency converter supplying the electricity network, and comparing a rate of change of network frequency with a normal value of the rate of change, wherein a single-phase islanding condition increases the rate of change of network frequency.

Known methods for single-phase islanding detection increase harmonic distortion in the electricity network and/or detect a single-phase islanding condition slowly.

SUMMARY

A method is disclosed for single-phase islanding detection in a three-phase electricity network, the method comprising: supplying power into a three-phase electricity network by a power supply assembly, the electricity network having a network voltage; providing a stimulus signal into a positive sequence electric quantity of the electricity network, the positive sequence electric quantity being current, power or a derived quantity thereof; monitoring a magnitude and/or a rate of change of an indicative element of a negative sequence component of the network voltage, a frequency domain of the indicative element including a frequency corresponding to the stimulus signal; and detecting a single phase islanding condition in the electricity network if the magnitude or rate of change of the indicative element exceeds a predetermined limit value, or if both the magnitude and rate of change of the indicative element exceed respective predetermined limit values.

A system is disclosed for detecting a single-phase islanding condition in a three-phase electricity network, the system comprising: means for providing a stimulus signal into a positive sequence electric quantity of a three-phase electricity network, the positive sequence electric quantity being current, power or a derived quantity thereof, the electricity network having a network voltage; means for monitoring a magnitude and/or a rate of change of an indicative element of a negative sequence component of the network voltage, a frequency domain of the indicative element including a frequency corresponding to the stimulus signal; and means for detecting a single phase islanding condition in the electricity network when the magnitude or rate of change of the indicative element exceeds a predetermined limit value, or when both the magnitude and rate of change of the indicative element exceed predetermined limit values.

BRIEF DESCRIPTION OF THE DRAWINGS

In the following, features disclosed herein will be described in greater detail by reference to exemplary embodiments, and with reference to the attached drawings, in which.

DETAILED DESCRIPTION

A method and a system for implementing the method are disclosed so as to enhance detection of single-phase islanding conditions.

As disclosed herein, exemplary embodiments add a stimulus signal into a positive sequence component of an electric quantity of an electricity network, the positive sequence electric quantity being current, power or a derived quantity thereof, and detecting a single phase islanding condition in the electricity network based on magnitude and/or rate of change of an indicative element of a negative sequence component of a voltage of the electricity network, a frequency domain of the indicative element including a frequency corresponding to the stimulus signal. According to exemplary embodiments, a stimulus signal supplied into a positive sequence electric quantity of an electricity network is detectable in a negative sequence component of a voltage of the electricity network only if impedances of the electricity network are not symmetrical. Therefore detection of a single phase islanding condition as disclosed herein can be, in principle, based on monitoring changes in symmetry of impedances of an electricity network.

An advantage of exemplary methods and systems disclosed herein is that a single-phase islanding condition can be detected quickly and without increasing harmonic distortion in the electricity network. In other words the disclosed methods and systems can enable detecting a single-phase islanding condition without any adverse effect on the power quality of the electricity network.

Figure 1:
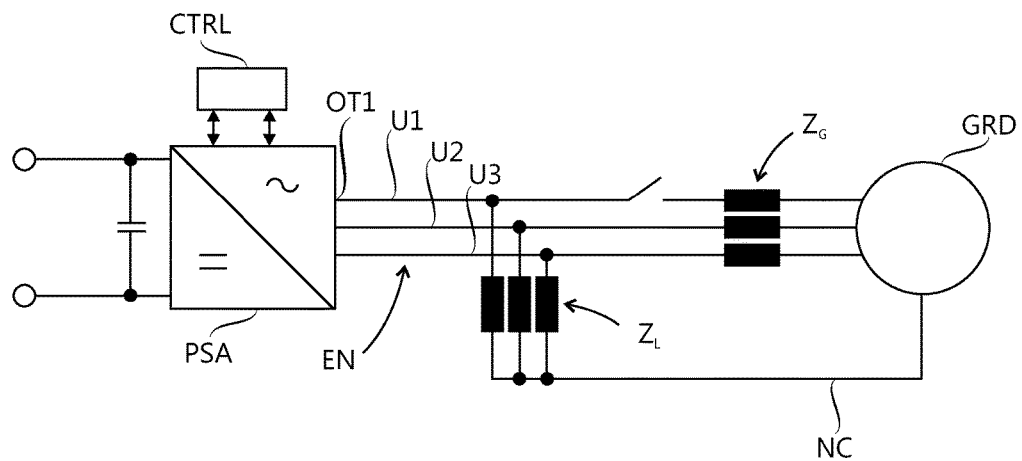
FIG. 1 shows a single-phase islanding condition of a three-phase electricity network.

FIG. 1 shows a three-phase electricity network EN with a single-phase islanding condition. There is at least one distributed energy resource unit (not shown) connected to the electricity network EN through a power supply assembly PSA. The electricity network EN has a network voltage and includes load $Z_L$ connected to phases U1, U2 and U3 of the electricity network.

The electricity network EN can be a part of a common electricity network GRD whose line impedance has been denoted with $Z_G$. In the single-phase islanding condition of FIG. 1 the phase U1 of the electricity network EN has lost connection with a corresponding phase of the rest of the common electricity network GRD. Therefore impedance seen from an output terminal OT1 of the power supply assembly PSA has changed.

The electricity network EN of FIG. 1 is provided with a neutral conductor NC. However, embodiments disclosed herein can also be utilized in electricity networks which do not have a neutral conductor.

Figure 2:
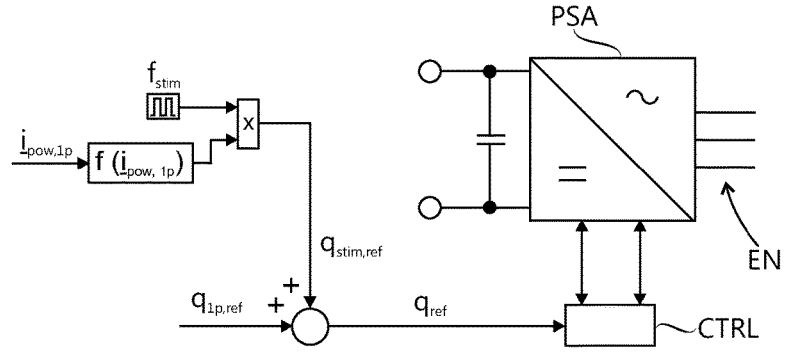
FIG. 2 illustrates an exemplary method for single-phase islanding detection in a three-phase electricity network.
Figure 2:
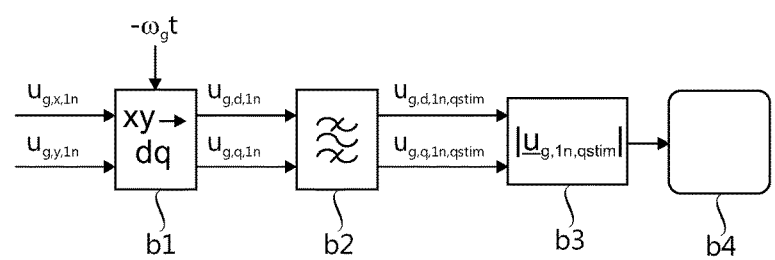

FIG. 2 shows a schematic diagram for detecting a single phase islanding condition in the three-phase electricity network EN of FIG. 1. The method illustrated by the schematic diagram includes supplying power into the three-phase electricity network EN by the power supply assembly PSA, providing a stimulus signal into a positive sequence reactive power of the electricity network, monitoring a magnitude of an indicative element of a negative sequence component of the network voltage, and detecting a single phase islanding condition in the electricity network EN if the magnitude of the indicative element exceeds a predetermined limit value.

A frequency domain of the indicative element includes a frequency corresponding to the stimulus signal. Depending on the analysis method used the frequency corresponding to the stimulus signal may be equal to the original frequency of the stimulus signal provided into the positive sequence electric quantity of the electricity network or different from the original frequency, as explained herein.

The stimulus signal used in the method of FIG. 2 includes a rectangular wave. Alternatively it is possible to use a different waveform such as a sinusoidal, triangle or sawtooth waveform, for example. A frequency $f_{stim}$ of the stimulus signal may be chosen quite freely. In an exemplary electrical network having a fundamental frequency of 50 Hz or 60 Hz, a frequency of the stimulus signal may be from 1 to 30 Hz, for example. A stimulus signal whose frequency is substantially lower than the frequency of the electricity network enables avoiding harmonic distortion. Technically it is quite possible to use a stimulus signal whose frequency is almost as high as the frequency of the electricity network or even higher than the frequency of the electricity network.

The method of symmetrical components is well-known in the field of electrical engineering, and it is not described herein. A positive sequence component is sometimes referred to as a direct component, and a negative sequence component is sometimes referred to as an inverse component.

In the embodiment of FIG. 2, the power supply assembly PSA includes a frequency converter, and the stimulus signal is provided into the electricity network EN by adding a stimulus reference signal $q_{stim,ref}$ into a positive sequence reactive power reference $q_{1p,ref}$ of the frequency converter. The positive sequence reactive power reference $q_{1p,ref}$ is a reference signal adapted to instruct the frequency converter to generate reactive power required by the electricity network EN. A sum signal $q_{ref}$ obtainable by the equation:

$$q_{ref}=q_{1p,ref}+q_{stim,ref}$$

is used as a positive sequence reactive power reference signal for controlling the frequency converter. Controlling a frequency converter by reference signals is well known in the art and therefore it is not discussed herein in detail.

A stimulus signal may be provided into a positive sequence electric quantity of the electricity network, the positive sequence electric quantity being current, power or a derived quantity thereof. Consequently a stimulus signal may be provided into a positive sequence active power of an electricity network instead of a positive sequence reactive power. It is also possible to provide a stimulus signal into positive sequence reactive current or positive sequence active current. Those skilled in the art understand that affecting positive sequence current inevitably affects positive sequence power and vice versa.

In a normal operating condition of the electricity network EN an amplitude of the stimulus signal is controlled based on a magnitude of a positive sequence active current $i_{pow,1p}$ supplied into the electricity network EN by the power supply assembly PSA. Amplitude of the stimulus signal is a function of the magnitude of a positive sequence active current $i_{pow,1p}$. Amplitude of the stimulus signal may be, for example, in the range of 0.1-10% of a nominal current of the power supply assembly. The bigger the amplitude the faster the time is to detect a single phase islanding condition. On the other hand it is not desirable to have excessive reactive current present in an electricity network.

In an exemplary embodiment, an absolute value of a positive sequence active current $i_{pow,1p}$ is multiplied by a coefficient. In an alternative embodiment an amplitude of the stimulus signal has additionally a constant part which is not dependent on amplitude of a positive sequence active current. The constant part enables detecting a single phase islanding condition in an electricity network even in situations where the electricity network has no load or where a load of the electricity network is small. In a further alternative embodiment an amplitude of the stimulus signal is constant.

If predetermined conditions are fulfilled the electricity network EN is transferred into a potential single-phase islanding condition in which the amplitude of the stimulus signal is assigned higher values than in the normal operating condition. In a potential single-phase islanding condition, amplitude of the stimulus signal may be 10% of amplitude of a positive sequence active current, or even higher.

In a potential single-phase islanding condition there is some reason to assume that a single-phase islanding condition might be present in the electricity network whereas in a normal operating condition there is no preliminary suspicion of an islanding condition. A purpose of a potential single-phase islanding condition is to accelerate detection of a single phase islanding condition in the electricity network.

A potential single-phase islanding condition is a temporary condition. If a single phase islanding condition is not detected during a potential single-phase islanding condition in a predetermined time, the electricity network is returned to the normal operating condition. In an exemplary embodiment, the predetermined time is approximately 1 second. In alternative embodiments the predetermined time may be for example from 0.3 seconds to 3 seconds.

The predetermined conditions for transferring the electricity network into the potential single-phase islanding condition can include one or more conditions which suggest that a single-phase islanding condition might be present in the electricity network. In an exemplary embodiment, the predetermined conditions comprise detecting an increase in the magnitude of the indicative element. The increase may be small; in many embodiments any increase detectable by instruments is sufficient to indicate a potential single-phase islanding condition.

Grid codes and standards relating to electricity networks normally do not allow any type of single-phase islanding condition. Therefore a method according to an exemplary embodiment disclosed herein can include a supply of power into the electricity network by the power supply assembly as a response to the detection of the single phase islanding condition. Alternatively it is possible to change an operating state of the electricity network as a response to a detected single-phase islanding condition. In some exemplary embodiments an alarm is provided to operating personnel of the electricity network so that the operating personnel can stop the power supply assembly from supplying power into the electricity network or to change an operating state of the electricity network in order to take the single-phase islanding condition into account.

A power supply into the electricity network by the power supply assembly may be stopped by opening a switch between the power supply assembly and the electricity network. Such a switch is not depicted in Figures. In an alternative embodiment stopping supplying power into the electricity network by the power supply assembly can include shutting down the power supply assembly.

In the embodiment of FIG. 2 a stimulus signal is supplied into a positive sequence reactive power of an electricity network by a frequency converter supplying power into the electricity network. In an alternative embodiment an electricity network can include a separate device adapted to supply a stimulus signal into the electricity network.

A method for single-phase islanding detection may be implemented by a control unit CTRL of the power supply assembly PSA supplying power into the electricity network EN. An electricity network may include one or more power supply assemblies each one of which is adapted to supply a stimulus signal into the electricity network and detect a single phase islanding condition in the electricity network. Stimulus signals of different power supply assemblies do not have to be synchronized. In an exemplary embodiment, each power supply assembly supplies a different stimulus signal than rest of the power supply assemblies.

Alternatively a method for single-phase islanding detection may be implemented by a central control unit adapted to monitor a magnitude of an indicative element of a negative sequence component of the network voltage and detect a single phase islanding condition in the electricity network if the magnitude of the indicative element exceeds a predetermined limit value. In a centralized system having a central control unit, control units of individual power supply assemblies neither monitor a magnitude of an indicative element nor detect a single phase islanding condition in the electricity network. In case the central control unit detects a single phase islanding condition in the electricity network the central control unit may command individual power supply assemblies to stop supplying power into the electricity network.

In the method illustrated by FIG. 2 a negative sequence of fundamental frequency of the network voltage is originally presented in a Cartesian coordinate system by x- and y-components $u_{g,x,1n}$ and $u_{g,y,1n}$. Then the negative sequence of a fundamental frequency of the network voltage is converted in block b1 into a direct-quadrature coordinate system rotating in a frequency of the electricity network in an opposite direction compared to a space vector of the network voltage. Resulting components denoted by $u_{g,d,1n}$ and $u_{g,q,1n}$ are band-pass filtered in block b2 in order to extract an indicative element of the negative sequence component of the network voltage, a frequency domain of the indicative element including a frequency corresponding to the stimulus signal. For example, if a frequency of a stimulus signal is 5 Hz a frequency domain of an indicative element may include frequencies from 4 Hz to 6 Hz. In an ideal situation it is sufficient to monitor an indicative element having the same frequency as the stimulus signal.

Components of the indicative element are denoted with $u_{g,d,1n,qstim}$ and $u_{g,q,1n,qstim}$. Magnitude $|u_{g,1n,qstim}|$ of the indicative element is calculated in block b3 and monitored in block b4. If there is no islanding condition and there are no changes in the network, the magnitude $|u_{g,1n,qstim}|$ of the indicative element remains substantially constant. A single phase islanding condition is detected if the magnitude of the indicative element exceeds a predetermined limit value. In an exemplary embodiment, the predetermined limit value is 3% of a comparison value. In alternative embodiments the predetermined limit value may be 0.3 to 5% of a comparison value. In an exemplary embodiment, the comparison value is an actual value of the network voltage. In an alternative embodiment the comparison value is a nominal value of the network voltage.

In an alternative embodiment the indicative element is presented in a direct-quadrature coordinate system rotating in a frequency of the stimulus signal. Those skilled in the art understand that a frequency in which a coordinate system rotates affects the frequency that a signal corresponding to the stimulus signal has in the coordinate system.

The already described band-pass filtering is only an example of a process suitable for separating a frequency corresponding to the stimulus signal. Alternatively, for example, a frequency domain analysis based on a suitable transformation such as the Fourier transform may be used.

In an exemplary embodiment, a rate of change of an indicative element of a negative sequence component of a network voltage is monitored and used for detecting a single phase islanding condition in an electricity network. It is possible to detect a single phase islanding condition based on a rate of change of an indicative element only. In such an embodiment a single phase islanding condition is detected if the rate of change of the indicative element exceeds a predetermined limit value. In an alternative embodiment a single phase islanding condition is detected if both magnitude and rate of change of the indicative element exceed respective predetermined limit values. It should be noted that a predetermined limit value for a rate of change of an indicative element may have a different value depending on whether a single phase islanding condition is detected based on a rate of change of an indicative element or based on both a rate of change of an indicative element and a magnitude of the indicative element.

Those skilled in the art will appreciate that the inventive concepts disclosed herein can be implemented in various ways. The invention and its embodiments are not limited to the examples described herein, but may vary within the scope of the claims.

Thus, it will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

The invention claimed is:

1. A method for single-phase islanding detection in a three-phase electricity network, the method comprising:
supplying power into a three-phase electricity network by a power supply assembly, the electricity network having a network voltage;
providing a stimulus signal into a positive sequence electric quantity of the electricity network, the positive sequence electric quantity being current, power or a derived quantity thereof;
monitoring a magnitude and/or a rate of change of an indicative element of a negative sequence component of the network voltage with the power supply assembly, a frequency domain of the indicative element including a frequency corresponding to the stimulus signal; and detecting a single phase islanding condition in the electricity network with the power supply assembly if the magnitude or rate of change of the indicative element exceeds a predetermined limit value, or if both the magnitude and rate of change of the indicative element exceed respective predetermined limit values.

2. The method according to claim 1, wherein the stimulus signal is provided into a positive sequence reactive electric quantity of the electricity network.

3. The method according to claim 1, wherein the stimulus signal comprises a rectangular, sinusoidal, triangle or sawtooth waveform.

4. The method according to claim 1, wherein the method comprises:

controlling an amplitude of the stimulus signal in a normal operating condition of the electricity network based on a magnitude of a positive sequence active electric quantity supplied into the electricity network by the power supply assembly, the positive sequence active electric quantity being current, power or a derived quantity thereof.

5. The method according to claim 1, wherein the method comprises:

transferring the electricity network from a normal operating condition into a potential single-phase islanding condition if predetermined conditions are fulfilled; and assigning an amplitude of the stimulus signal higher values than in the normal operating condition while the electricity network is in the potential single-phase islanding condition.

6. The method according to claim 5, wherein the predetermined conditions for transferring the electricity network into the potential single-phase islanding condition comprise:

detecting an increase in the magnitude of said indicative element.

7. The method according to claim 5, wherein the potential single-phase islanding condition is a temporary condition such that if the single phase islanding condition is not detected during the potential single-phase islanding condition in a predetermined time, the electricity network is returned to the normal operating condition.

8. The method according to claim 1, wherein the method comprises:

stopping a supply of power into the electricity network by the power supply assembly as a response to a detection of the single phase islanding condition.

9. The method according to claim 1, wherein the negative sequence component of the network voltage is presented in a direct-quadrature coordinate system rotating in a frequency of the electricity network in an opposite direction compared to a space vector of the network voltage, wherein a frequency corresponding to the stimulus signal in the direct-quadrature coordinate system is equal to an original frequency of the stimulus signal provided into the positive sequence electric quantity of the electricity network.

10. The method according to claim 1, wherein the power supply assembly includes a frequency converter, and the method comprises:

providing the stimulus signal into the electricity network by adding a stimulus reference signal into a positive sequence electric quantity reference of the frequency converter.

11. A system for detecting a single-phase islanding condition in a three-phase electricity network, the system comprising a power supply assembly for supplying power into the three-phase electricity network having a network voltage, wherein the power supply assembly is adapted to:

provide a stimulus signal into a positive sequence electric quantity of the three-phase electricity network, the positive sequence electric quantity being current, power or a derived quantity thereof;

monitor a magnitude and/or a rate of change of an indicative element of a negative sequence component of the network voltage, a frequency domain of the indicative element including a frequency corresponding to the stimulus signal; and detect a single phase islanding condition in the electricity network when the magnitude or rate of change of the indicative element exceeds a predetermined limit value, or when both the magnitude and rate of change of the indicative element exceed predetermined limit values.

12. The system according to claim 11, wherein the power supply assembly comprises a frequency converter, the system being adapted to provide the stimulus signal into the electricity network by adding a stimulus reference signal into a positive sequence electric quantity reference of the frequency converter.

13. The system according to claim 11, wherein the stimulus signal comprises a rectangular, sinusoidal, triangle or sawtooth waveform.

14. The system according to claim 11, wherein the power supply assembly is configured to control an amplitude of the stimulus signal in a normal operating condition of the electricity network based on a magnitude of a positive sequence active electric quantity supplied into the electricity network by the power supply assembly, the positive sequence active electric quantity being current, power or a derived quantity thereof.

15. The system according to claim 11, wherein the power supply assembly is configured to transfer the electricity network from a normal operating condition into a potential single-phase islanding condition if predetermined conditions are fulfilled, and to assign an amplitude of the stimulus signal higher values than in the normal operating condition while the electricity network is in the potential single-phase islanding condition.

16. The system according to claim 11, wherein the power supply assembly is configured to stop a supply of power into the electricity network as a response to a detection of the single phase islanding condition.

17. The system according to claim 11, wherein the negative sequence component of the network voltage is presented in a direct-quadrature coordinate system rotating in a frequency of the electricity network in an opposite direction compared to a space vector of the network voltage, wherein a frequency corresponding to the stimulus signal in the direct-quadrature coordinate system is equal to an original frequency of the stimulus signal provided into the positive sequence electric quantity of the electricity network.

* * * * *